United States Patent [19]

Teruyama

[11] Patent Number: 5,733,799
[45] Date of Patent: Mar. 31, 1998

[54] MANUFACTURING METHOD OF SEMICONDUCTOR DEVICE COMPRISING MOLDED RESIN ENCAPSULATING A SEMICONDUCTOR CHIP

[75] Inventor: Hidenori Teruyama, Oita, Japan

[73] Assignee: Sony Corporation, Japan

[21] Appl. No.: 611,084

[22] Filed: Mar. 5, 1996

[30] Foreign Application Priority Data

Mar. 8, 1995 [JP] Japan ................ 7-047984

[51] Int. Cl.$^6$ ................ H01L 21/60
[52] U.S. Cl. ................ 437/207; 437/205; 437/214; 437/217; 437/219; 437/220
[58] Field of Search ................ 437/209, 210, 437/211, 214, 215, 216, 217, 218, 219, 220, 207

[56] References Cited

U.S. PATENT DOCUMENTS 4,920,074  4/1990  Shimizu et al. ................ 437/217
5,347,709  9/1994  Maejima et al. ................ 437/217
5,474,958  12/1995  Djennas et al. ................ 437/211

Primary Examiner—Kevin Picardat
Attorney, Agent, or Firm—Ronald P. Kananen

[57] ABSTRACT

This invention provides a method for manufacturing a semiconductor device having molded resin encapsulating a semiconductor chip and external leads extending from this molded resin to the outside, wherein excess resin projecting from edge portions of the molded resin is removed after a resin encapsulating step and a wax film is reformed on break surfaces and cracked parts of the molded resin produced in the excess resin removing step by heating the molded resin to a predetermined temperature after removing tie-bars from the external leads, whereby abnormal growth of solder between the external leads in a subsequent solder plating process is prevented and failures caused by short-circuiting between terminals are thereby prevented.

10 Claims, 4 Drawing Sheets

5,733,799

MANUFACTURING METHOD OF SEMICONDUCTOR DEVICE COMPRISING MOLDED RESIN ENCAPSULATING A SEMICONDUCTOR CHIP

BACKGROUND OF THE INVENTION

1. Field of the Invention

This invention relates to a method of manufacturing a semiconductor device comprising molded resin encapsulating a semiconductor chip.

2. Description of the Related Art

FIG. 1 is a fragmentary perspective view of a complete semiconductor device.

In the manufacture of such a semiconductor device comprising a semiconductor chip encapsulated in molded resin, in general, after encapsulating the semiconductor chip with molded resin 1, post-curing is carried out in order to harden the molded resin 1 after molding. Excess resin (resin dams, resin burrs and the like) projecting from the periphery of the molded resin 1 is then removed using a trimming punch or high-pressure water, the tie-bars connecting together external leads 2 are cut off and then solder plating of the surface of the external leads 2 is carried out as a covering treatment.

FIGS. 2A to 2C are enlarged views illustrating exemplified procedures in an excess resin removing step.

When post-curing is carried out after the resin encapsulation, a wax film 1a is formed on the surface of the molded resin 1 by a wax component in the resin, as shown in FIG. 2A.

However, in the above-mentioned manufacturing method, as shown in FIG. 2B, when excess resin projected from the periphery of the molded resin 1 at the time of the resin encapsulation, especially resin dams 1b filling the space enclosed between the external leads 2 and the tie-bars, is cut off with a trimming punch 3 or the like, a break surface 1c of the molded resin 1 is exposed to the outside and cracks 4 sometimes appear due to stresses acting at the time of cutting. Because the break surface 1c and the surface of the crack 4 are not covered with the wax film 1a as are the surfaces of other portions of the molded resin are, after the molded resin 1 is immersed in cleaning liquid and washing of the resin surfaces is carried out as shown in FIG. 2C. When the molded resin 1 is immersed in a chemical polishing solution as shown in FIG. 3A, a substance α which becomes nuclei of the solder plating adheres to the break surface 1c and to the crack surface 4a, which have no wax film 1a thereon. Then, as shown in FIG. 3B, when a voltage is impressed on a positive plate 5 and solder plating is carried out, a solder component β adheres not only to the surfaces of the external leads 2 which are the target but also to the break surface 1c and the crack surface 4a of the molded resin 1a, and "abnormal growth of solder" occurs there.

As a result, short-circuiting occurs between the leads due to the abnormal solder growth. In particular, along with recent increases in the number of pins, there is a marked tendency for terminal pitches to be narrower, and frequent occurrence of short-circuiting of leads accompanying abnormal soldering growth has been a major cause of reduced manufacturing yield.

It is an object of this invention to provide a manufacturing method of a semiconductor device which method prevents abnormal growth of solder on break surfaces and cracks of the molded resin produced in the excess removing step so as not to cause short-circuiting between terminals.

SUMMARY OF THE INVENTION

This invention provides a manufacturing method of a semiconductor device having molded resin encapsulating a semiconductor chip and external leads extending from this molded resin to the outside, the method comprising a resin encapsulating step of encapsulating a semiconductor chip with molded resin, an excess resin removing step of removing excess resin projecting from the peripheral edge portion of the molded resin after this resin encapsulating step, a tie-bar removing step of removing tie-bars connected between the external leads, and a heating step of heating the molded resin to a predetermined temperature after this tie-bar removing step.

By heating the molded resin after the excess resin is removed, a wax film is formed again on the break surfaces and cracked portions of the molded resin created during the excess resin removing step. Since, as a result, the entire body of molded resin is covered with wax film, it is possible to prevent abnormal growth of solder between the external leads during the subsequent solder plating process and defects caused by short-circuiting across terminals are prevented.

DETAILED DESCRIPTION OF THE PREFERRED EMBODIMENTS

The present invention focuses on the fact that, when a molded, resin is heated after being molded a wax film is formed on the surface of the molded resin by the wax component contained in the resin, and carries out heat treatment for forming a wax film after an excess resin removing step in which break surfaces are exposed at the molded resin surface. The invention will now be explained in detail based on the preferred embodiment described below.

Figure 1:
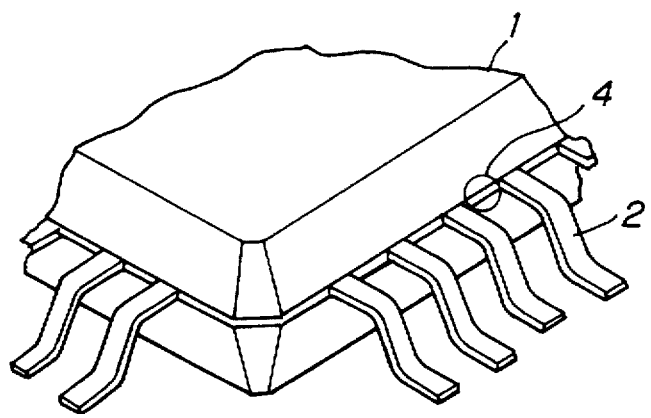
FIG. 1 is a fragmentary perspective view of a complete semiconductor device.
Figure 2A:
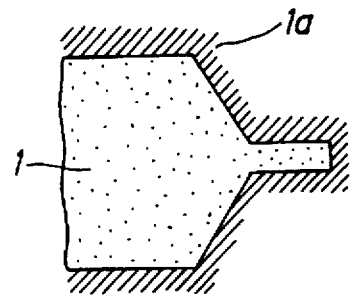
FIGS. 2A to 2C are enlarged views illustrating exemplified procedures in an excess resin removing step in a manufacturing method of semiconductor device.
Figure 2B:
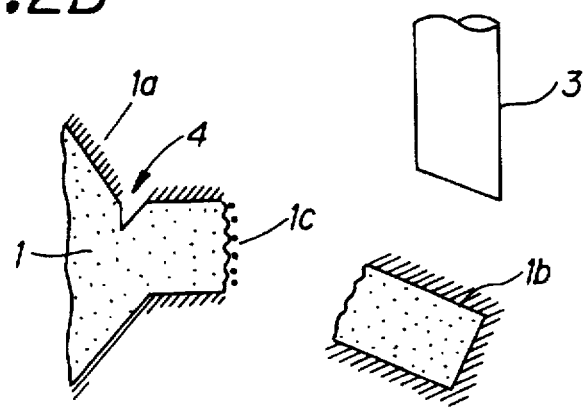
Figure 2C:
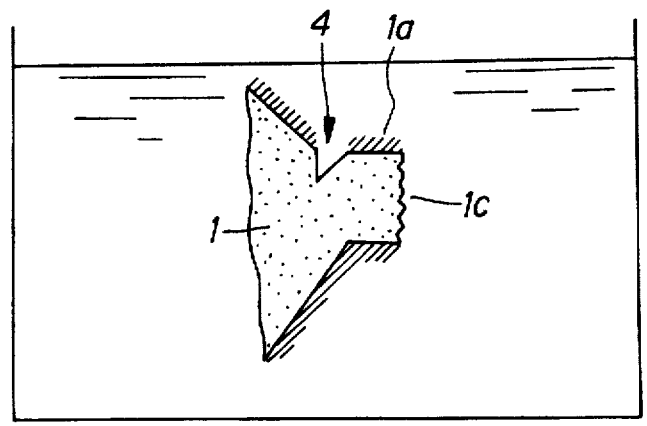
Figure 3A:
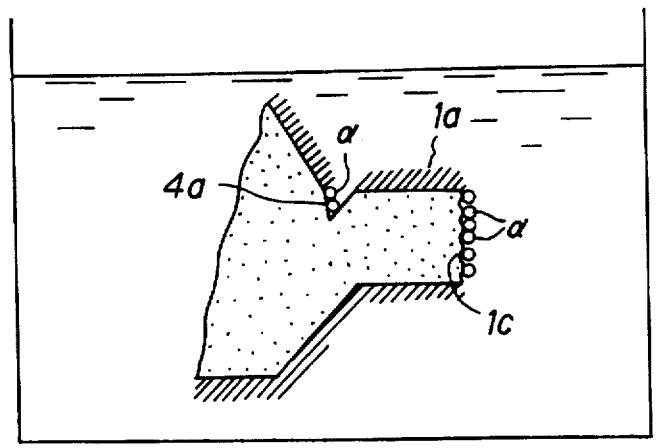
FIGS. 3A and 3B are enlarged views illustrating break surfaces for explaining problems associated with the manufacturing method illustrated in FIGS. 2A to 2C.
Figure 3B:
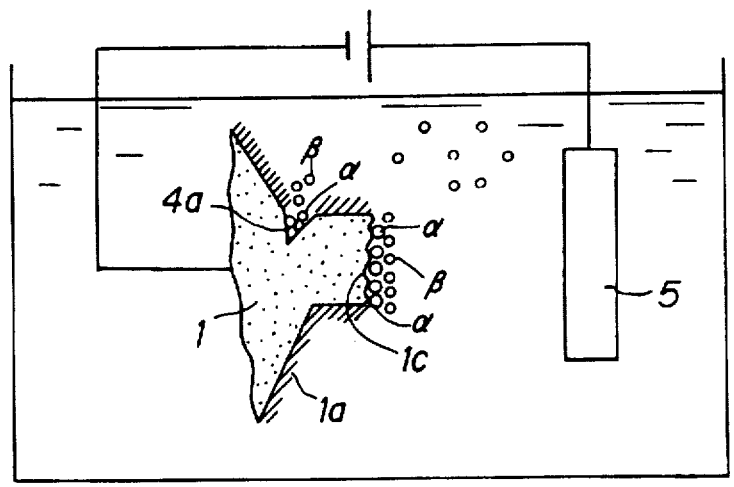
Figure 4:
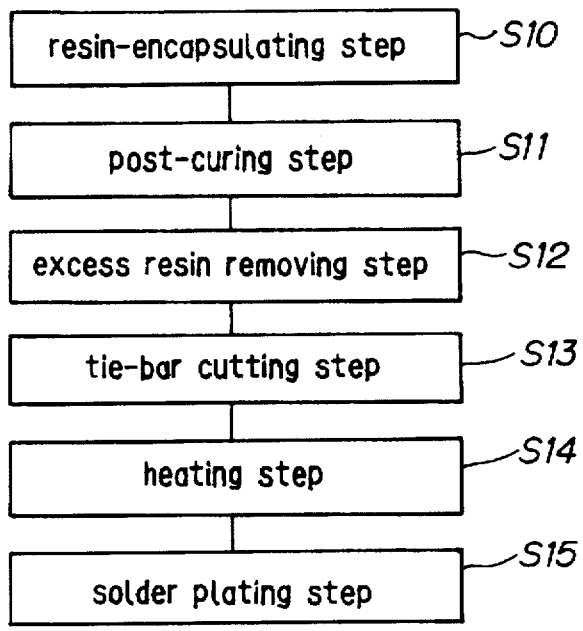
FIG. 4 is a flow chart illustrating an embodiment of the process for the manufacturing method of the invention.

FIG. 4 is a flow chart illustrating a preferred embodiment of a process for a semiconductor device manufacturing method according to the invention.

First, prior to molded resin encapsulation, chips individually divided from a wafer are die-bonded onto a die-pad of a lead frame and then electrically connected to internal leads of the lead frame by a connecting method such as wire bonding.

Next, the lead frame with the chip mounted thereon is supplied to a molding apparatus and the semiconductor chip on the lead frame is encapsulated in resin (resin encapsulating step: S10) by means of a mold in the molding apparatus.

Because the molded resin molded into the shape of the mold cavity is not completely hardened immediately after this resin encapsulation, after the resin encapsulation, the hardening of the molded resin is accelerated by heating (post-curing step: S11). At this step, a wax film is formed on the surface of the molded resin by the wax component in the resin (generally polyethylene wax, carnauba wax, and so forth)

Figure 5A:
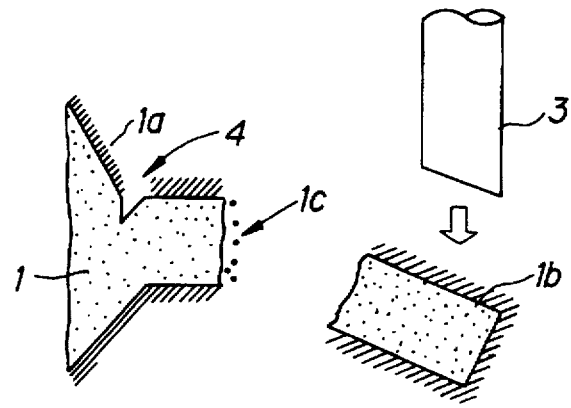
FIGS. 5A and 5B are enlarged views illustrating break surfaces in the manufacturing method of the invention.

Next, the excess resin which projected from the peripheral edge portion of the molded resin at the time of the resin encapsulation, i.e., in this case, a resin dam filling the space enclosed by the leads and the tie-bars, is cut off using a trimming punch 3 or the like as shown in FIG. 5A (excess resin removing step: S12). At this time, the break surface 1c created by the cutting of the resin dam (excess resin) 1b is exposed to the outside. Also, depending on the stress at the time of cutting, cracks 4 sometimes occur in the peripheral edge portion of the molded resin 1. Cleaning of the surface of the molded resin 1 after removal of the resin dam and removal of resin burrs (water pressure deburring) having run out through gaps between the lead frame and the mold during the resin encapsulation are also carried out in the excess resin removing step S12.

Next, the tie-bars connecting together the leads of the lead frame are cut and the individual leads are thereby made independent (tie-bar cutting step: S13).

Figure 5B:
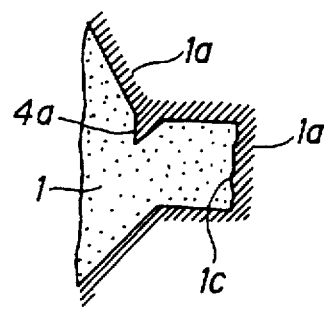

After that, the semiconductor device is put into, for example a heating furnace to heat the molded resin 1 to a predetermined temperature (heating step: S14). As a result, the wax component in the resin is caused by the heat treatment to soak out onto the break surface 1c and the crack surface 4a of the molded resin 1 exposed in the foregoing excess resin removing step S12. By solidifying the wax component in that state, a wax film 1a of wax component is formed on the break surface 1c and the crack surface 4a as it is on the other resin surfaces. As a result, as shown in FIG. 5B, the entire surface of the molded resin 1 is covered with the wax film 1a.

Here, as the heating temperature for forming the wax film 1a, a temperature higher than the melting point of the wax component contained in the resin (about 70° to 100° C.) is necessary, but this depends greatly on the composition of the molded resin 1; also, because if this temperature is set extremely high there is a danger of damaging the semiconductor chip, the heating temperature should be suitably set to a temperature which is above the melting point of the wax component contained in the resin and which also will not damage the semiconductor chip. Regarding the heating time, a long heating time is advantageous in obtaining a sufficient film thickness, but in setting the heating time, it is also important to consider productivity.

Accordingly, as a preferable example, the post-curing step S11 carried out after the resin encapsulation step S10 and the heating step S14 are combined to be carried out as one heating step after the excess resin removing step S12 (for example after the tie-bar cutting step S13). When this is done, just by performing heat treatment under the same conditions as the heating conditions in the present post-curing step S11, it is possible to form a wax film 1a over the whole surface of the resin including the break surface 1c and the crack surface 4a at the same time as accelerating the hardening of the molded resin 1, and it becomes possible to practice the invention without increasing the number of steps or reducing productivity.

After heat treatment is thus carried out, solder plating is carried out conventionally (solder plating step: S15). At this point, because as described above the entire surface of the molded resin 1 including the break surface 1c and the crack surface 4a is covered by the wax film 1a, there is no adhering of matter which will constitute nuclei of the solder plating to the break surface 1c or the crack surface 4a as there is with conventional methods. As a result, abnormal growth of solder on resin parts between the leads is surely prevented and it is possible to solder plate the lead surfaces only.

The results of experiments carried out by the present inventors proved that by forming a wax film 1a by heat treatment after the excess resin removing step S12 it is possible to surely prevent the occurrence of short-circuiting between leads caused by abnormal growth of solder.

When actually mounting this kind of resin-encapsulated semiconductor device on a printed circuit board or the like, cracking and swelling of the molded resin caused by moisture absorption and peeling at the die-pad interface are a problem. In particular, where break surfaces 1c and crack surfaces 4a are exposed at the surface of the molded resin 1 as described above, the hygroscopicity is higher than that of the rest of the resin surface, which is covered in the wax film 1a.

However, as described in the above preferred embodiment, by covering the break surfaces 1c and the crack surfaces 4a with the wax film 1a in the same way as the rest of the surface of the resin in the heat treatment step S14 after the excess resin removing step S12, it is possible to effectively suppress the hygroscopic action of the molded resin 1 and it is possible to provide a semiconductor device having excellent resistance to cracking.

A semiconductor device manufacturing method according to the invention can be widely applied as a resin-encapsulated semiconductor device manufacturing method in cases such as the manufacture of a QFP (Quad Flat Package) or SOP (Small Outline Package) necessitating a step of removing excess resin after resin-encapsulating a semiconductor chip.

What is claimed is:

1. A semiconductor device manufacturing method, comprising the procedural combination of steps of:

a resin encapsulating step of encapsulating a semiconductor chip with resin;

a resin removing step of removing resin between external leads;

a tie-bar removing step of removing a tie-bar connected between said external leads;

a heating step of heating said resin and accelerating hardening of said resin and forming a wax component on the surface of said resin; and a plating step of plating said external leads, wherein said heating step is carried out after said tie-bar removing step.

2. A semiconductor device manufacturing method according to claim 1, wherein cleaning of the semiconductor device is carried out after said tie-bar removing step and before said heating step.

3. A semiconductor device manufacturing method according to claim 1, wherein said heating step is carried out at a heating temperature higher than the melting point of the wax component contained in the resin but below a temperature which will damage the semiconductor chip.

4. A semiconductor device manufacturing method according to claim 3, wherein said melting point of the wax component is about 70° to 100° C.

5. A semiconductor device manufacturing method according to claim 1, wherein said wax component is formed on a break surface and a crack surface of said resin.

6. A semiconductor device manufacturing method according to claim 1, wherein said second heating step is carried out at a heating temperature higher than the melting point of the wax component contained in the resin but below a temperature which will damage the semiconductor chip.

7. A semiconductor device manufacturing method according to claim 6, wherein said melting point of the wax component is about 70° to 100° C.

8. A semiconductor device manufacturing method, comprising:

a resin encapsulating step of encapsulating a semiconductor chip with resin;

a first heating step of hardening the resin;

a resin removing step of removing resin between external leads;

a tie-bar removing step of removing a tie-bar connected between said external leads;

a second heating step at a temperature greater that the melting point of a wax component of said resin, and forming a wax component on the surface of said resin; and a plating step of plating said external leads, wherein said second heating step is carried out after said tie-bar removing step.

9. A semiconductor device manufacturing method according to claim 8, wherein cleaning of the semiconductor device is carried out after said tie-bar removing step and before said second heating step.

10. A semiconductor device manufacturing method according to claim 8, wherein said wax component is formed on a break surface and a crack surface of said resin.

* * * * *